US012812771B2

(12) United States Patent
Iyyamperumal et al.

(10) Patent No.: US 12,812,771 B2
(45) Date of Patent: Nov. 24, 2026

(54) SYSTEM FOR PROTECTING PRODUCT AUTHENTICITY

(71) Applicant: Rockwell Automation Asia Pacific Business Center Pte. Ltd., Corporate Place (SG)

(72) Inventors: Siva Iyyamperumal, Singapore (SG); Sean Homan, Kovan Regency (SG); Srinivasan Melkote, Singapore (SG)

(73) Assignee: Rockwell Automation Asia Pacific Business Center. Pte. Ltd., Singapore (SG)

( * ) Notice: Subject to any disclaimer, the term of this patent is extended or adjusted under 35 U.S.C. 154(b) by 219 days.

(21) Appl. No.: 18/908,186

(22) Filed: Oct. 7, 2024

(65) Prior Publication Data

US 2026/0101433 A1 Apr. 9, 2026

(51) Int. Cl.

| | |
|---|---|
| ***H05K 1/14*** | (2006.01) |
| ***G06K 7/10*** | (2006.01) |
| ***H05K 1/02*** | (2006.01) |

(52) U.S. Cl.

CPC ....... *H05K 1/0275* (2013.01); *G06K 7/10297* (2013.01); *H05K 1/0266* (2013.01); *H05K 1/14* (2013.01); *H05K 2201/10098* (2013.01)

(58) Field of Classification Search

USPC .......................................................... 361/784

See application file for complete search history.

(56) References Cited

U.S. PATENT DOCUMENTS

| | | | | |
|---|---|---|---|---|
| 8,278,948 | B2 * | 10/2012 | Johnson | G08B 13/1418 340/568.1 |
| 10,653,046 | B2 * | 5/2020 | Hong | H01Q 1/243 |
| 11,379,624 | B2 * | 7/2022 | Mobley | G09C 1/00 |
| 11,481,520 | B2 * | 10/2022 | Moore | H04L 9/0643 |
| 11,596,053 | B2 * | 2/2023 | Files | H05K 1/023 |
| 2020/0127404 | A1 * | 4/2020 | Seo | H01Q 5/42 |
| 2021/0097522 | A1 | 4/2021 | Martin et al. | |

(Continued)

FOREIGN PATENT DOCUMENTS

EP 2465102 B1 12/2013

OTHER PUBLICATIONS

European Search Report for Application No. 25202745.3 (12 pages).

(Continued)

*Primary Examiner* — Timothy J Thompson
*Assistant Examiner* — Michael F Mcallister
(74) *Attorney, Agent, or Firm* — Boyle Fredrickson, S.C.

(57) ABSTRACT

A system for authentication of a product includes at least one printed circuit board. First and second printed circuit boards may each include near field communication circuits in communication with each other. A processor mounted on one of the printed circuit boards may read an identifier from each near field communication circuit and verify that the identifiers are identical. The at least one printed circuit board is mounted within a housing, where an interior surface of the housing may include a first security member. A second security member is mounted on the at least one printed circuit board. When the at least one printed circuit board is mounted within the housing, the first security member engages the second security member to positively retain the at least one printed circuit board to the housing.

20 Claims, 8 Drawing Sheets

(56) References Cited

U.S. PATENT DOCUMENTS

| | | | | |
|---|---|---|---|---|
| 2021/0212612 | A1 | 7/2021 | Hohl et al. | |
| 2022/0188462 | A1 | 6/2022 | Moore et al. | |
| 2023/0396289 | A1* | 12/2023 | Palmer, Jr. ............... | H04B 5/77 |

OTHER PUBLICATIONS

Partial European Search Report for Application No. 25202745.3 issued on Dec. 4, 2025 (12 pages).

* cited by examiner

SYSTEM FOR PROTECTING PRODUCT AUTHENTICITY

BACKGROUND INFORMATION

The subject matter disclosed herein relates to a system for protecting authenticity of a product which includes printed circuit board assemblies. More specifically, a data key is encrypted and embedded in a near field communication device on each printed circuit board, where the encrypted key is used to verify the authenticity of each board. The printed circuit board may also be physically connected to a housing for the product, preventing removal of the circuit board from the product.

As is known to those skilled in the art, many electronic devices include one or more printed circuit board (PCB) assemblies, where each PCB assembly includes multiple printed circuit boards (PCBs). At some point, one of the PCBs may fail. Upon failure, the PCB must be repaired or the electronic device replaced. Repair or replacement of a device or of a PCB is commonly performed by the original manufacturer of the device. Utilizing the original manufacturer for service ensures the same level of quality and function as the original device.

However, as is also known to those skilled in the art, numerous third-party vendors may attempt to repair or to supply replacement devices. While some third-party vendors are reputable and may work with the original manufacturer to ensure compliance and compatibility of a replacement part or device, other third-party vendors may not be so reputable. Some third-party vendors may acquire damaged and discarded equipment from customers of the original manufacturer. This third-party vendor may take one PCB from one device as an attempt to replace a damaged PCB on another device. The replacement PCB may not be compatible with the first device or may not have the same function as the original PCB. Even if the replacement PCB is compatible, because it was taken from another defective device, the expected life of the repaired product may be less than expected. Still other third-party vendors may attempt to reverse engineer portions of the PCB assembly or even the entire device. These third-party vendors may pass off poor quality imitation devices either as counterfeit devices, representing the imitation device is an original device, or as acceptable replacements for the original devices. The replacement devices may fail prematurely, function improperly, or even fail to work entirely. Poor repairs and/or counterfeit devices can damage the reputation of the original manufacturer and cost the customer time and money both on the counterfeit device and with lost productivity.

Thus, it would be desirable to provide a system and method for ensuring the authenticity of a product with PCB assemblies.

BRIEF DESCRIPTION

According to one embodiment of the invention, a system for authentication of a product includes a printed circuit board assembly, a memory, and a processor. The printed circuit board assembly includes a first printed circuit board with a first near field circuit and a second printed circuit board with a second near field circuit. The first near field circuit is in communication with the second near field circuit. The memory is mounted on either the first printed circuit board or the second printed circuit board and is operative to store multiple instructions. The processor is mounted on either the first printed circuit board or the second printed circuit board. The processor is operative to read a first identifier from the first near field circuit, read a second identifier from the second near field circuit, and verify that the first identifier is identical to the second identifier.

According to another embodiment of the invention, a system for authentication of a product includes a housing with an interior surface and an exterior surface and at least one printed circuit board mounted within the housing. A first security member is mounted to an interior surface of the housing, and a second security member is mounted on the at least one printed circuit board. When the at least one printed circuit board is mounted within the housing, the first security member engages the second security member to positively retain the at least one printed circuit board to the housing.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
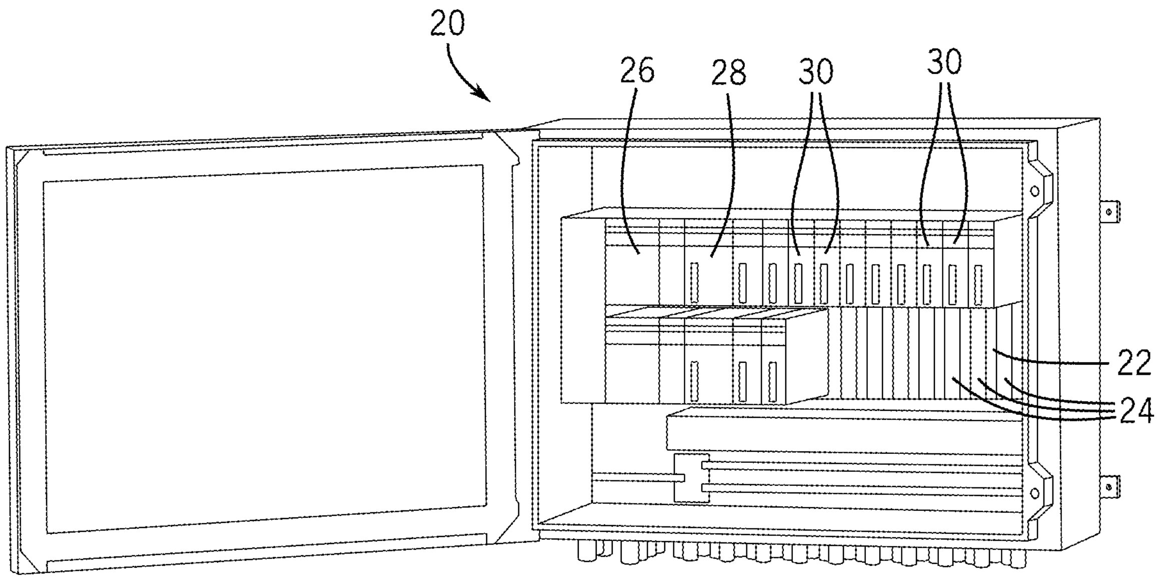
FIG. 1 is a front elevation view of an exemplary control cabinet including a module incorporating one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

The subject matter disclosed herein describes a system and method for ensuring the authenticity of a product with PCB assemblies. The present invention describes both an electronic and a mechanical method for ensuring authenticity of the product. As an electronic countermeasure to counterfeit devices, a Near Field Communication (NFC) circuit may be mounted on each PCB in the PCB assembly. The NFC circuit on each PCB is positioned such that each NFC circuit on adjacent PCBs is able to communicate with the other. During manufacture of the PCB assembly, a unique key, corresponding to a serial number for the product, is generated. The unique key is stored in each NFC circuit and locked to prevent subsequent write access to the key. Upon power up, firmware in the product which houses the PCB assembly determines whether every PCB in the PCB assembly has the correct key. A series of reads from the NFC circuit on each PCB in the PCB assembly provides the key presently stored in the NFC to a processor on the PCB assembly. If all PCBs include the correct key, the processor determines that the PCBs are authentic and permits the power-on sequence to proceed. If any of the PCBs do not include the correct key, the processor determines that the PCB without the correct key is counterfeit or taken from another device. The firmware will prevent the product from proceeding with the power-on sequence and will cause the product to remain in a powered off state. Additionally, the firmware may corrupt the operating system of the product itself, rendering the product inoperative.

As a physical countermeasure to counterfeit devices, a security PCB may be included with the PCB assembly. The security PCB is typically a small, dedicated PCB on which a few signals pass through. Alternately, the security PCB may be a portion of a larger PCB configured to break apart from the larger PCB. The security PCB includes a physical connection to the housing of the product. As the PCB assembly is mounted within the housing, a mechanical coupling between the housing and the security PCB occurs. A pin, for example, extending from the interior of the housing may engage an opening in the security PCB. During insertion of the pin into the opening, the pin is secured within the opening, preventing the pin from being pulled back out. If the product is opened by a third party and the PCB assembly is removed from the housing, the security PCB is pulled from the PCB assembly and retained against the housing. Because the critical signals which passed through the security PCB no longer have a complete path, the PCB assembly becomes non-functional. Additionally, the firmware in the product may monitor the signals on the security PCB and when the signals are no longer present determine that the security PCB has been removed. Upon determining that the security PCB has been removed, the firmware may similarly corrupt the operating system of the product itself, rendering the product inoperative.

Turning initially to FIG. 1, an exemplary control cabinet 20 is illustrated. The control cabinet 20 includes remote inputs and outputs (I/O). The control cabinet 20 may be mounted on a controlled machine or process proximate sensors providing input signals and actuators requiring output signals. An industrial controller such as a programmable logic controller (PLC) may be located in another control cabinet or in a control room. An industrial network provides communication between the industrial controller and the remote I/O. According to the illustrated embodiment, a backplane 22 is mounted within the control cabinet 20. The backplane 22 includes a plurality of slots 24 into which a module for the remote I/O may be inserted. Modules may include a power supply module 26, a remote I/O adapter 28, or various I/O modules 30.

Figure 2:
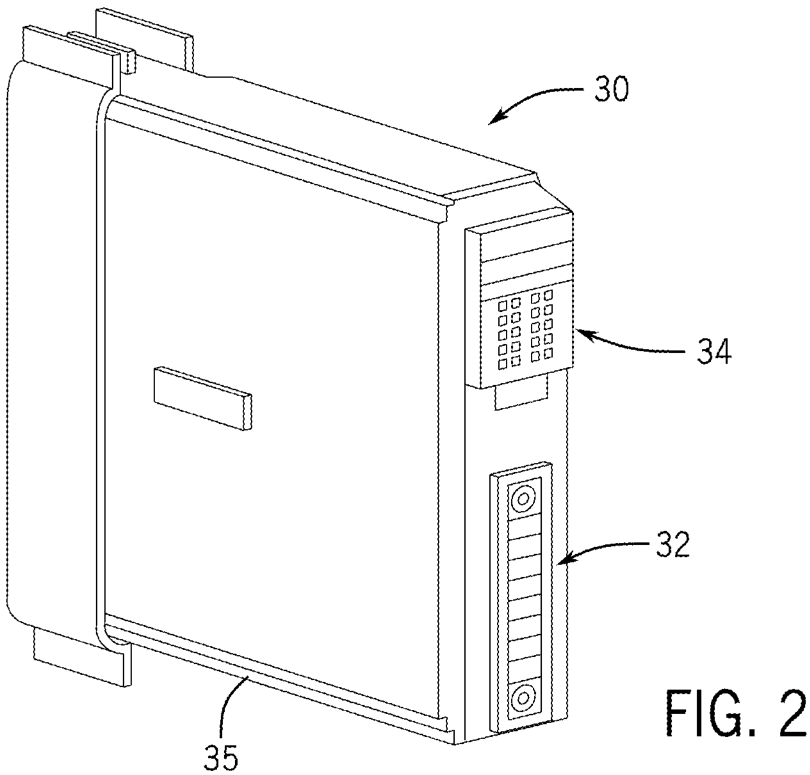
FIG. 2 is a perspective view of an exemplary module incorporating one embodiment of the invention.
Figure 3:
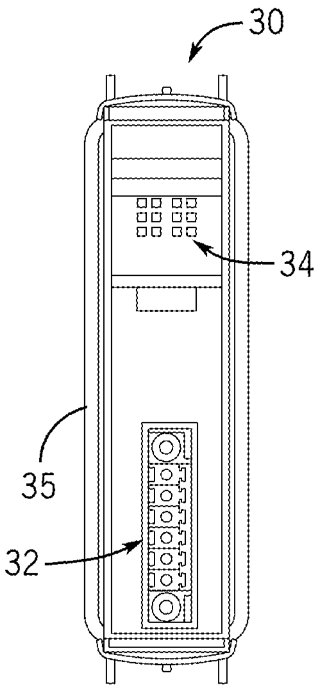
FIG. 3 is a front elevation view of the module of FIG. 2.
Figure 4:
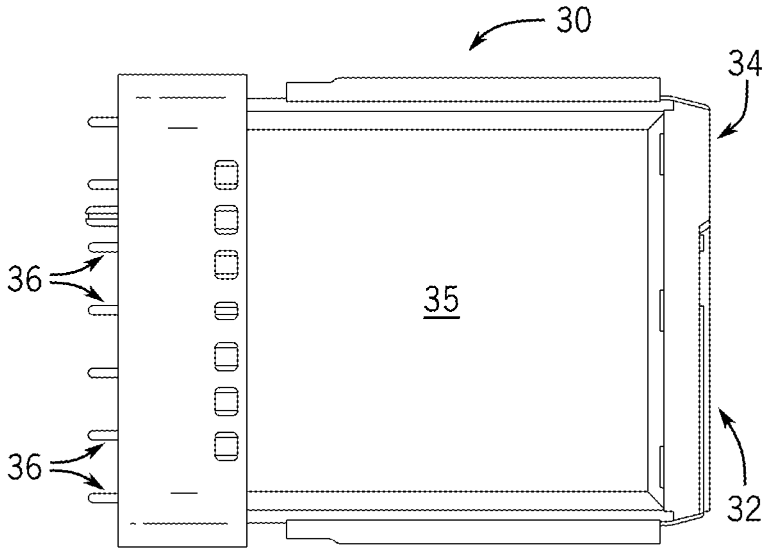
FIG. 4 is a side elevation view of the module of FIG. 2.

With reference also to FIGS. 2-4, an exemplary I/O module 30 includes terminals 32 to which wires are connected. The wires extend between the I/O module 30 and a device in the controlled system which either generates signals, received as inputs at the I/O module, or receives signals, sent as outputs from the I/O module. A series of LEDs 34 provide an indication of the status of the input or output signal at each terminal 32. The I/O module includes a housing 35, generally enclosing the module and pins 36 extending from the back of the I/O module 30. The pins 36 are configured to be inserted into complementary receptacles in one of the slots 24 on the backplane 22.

Each I/O module 30 as well as the remote I/O adapter 28 are configured to communicate via the backplane. Therefore, each module includes a communication interface circuit to send and receive data. It is also possible to distribute some processing capabilities to the I/O modules 30. The I/O modules 30 may, for example, generate data packets by which data is communicated on the backplane. Input signals are packaged into data packets and output signals are extracted from data packets. The I/O module 30 may convert an analog signal to a digital value prior to insertion in a data packet. I/O modules 30 may perform some initial signal processing such as filtering, averaging, unit conversion, and the like, where the initial signal processing requires memory configured to store data and instructions and a processor configured to execute the instructions. Each I/O module 30 is configured according to the requirements of the module to include memory and/or a processor.

The remote I/O adapter 28 is further configured to communicate on an industrial network. The remote I/O adapter 28 includes either a second communication interface or an enhanced communication interface that, in addition to communication on the backplane, is configured to send and receive data packets via the industrial network. The remote I/O adapter 28 is primarily responsible for transmitting data between the devices in the controlled machine or process and an industrial controller configured to control the machine or process. The remote I/O adapter receives the status of each input signal from all of the I/O modules 30 via the backplane 22 and generates data packets to transmit the input signals to the industrial controller. Similarly, the remote I/O adapter 28 receives data packets from the industrial controller including data signals to be provided as output signals. The remote I/O adapter 28 extracts the data signals from the data packets and distributes the data signals to the appropriate I/O modules 30 via the backplane 22.

Operation of the I/O modules 30 and the remote I/O adapter 28 typically requires at least one PCB be present within the module and may include multiple PCBs in a PCB assembly. A primary PCB, for example, may include a processor, memory, and various electronic circuits to control functionality that is common between different I/O modules 30 or between different remote I/O adapters 28. Additional PCBs may be inserted into slots, soldered onto the primary PCB, or otherwise included within the housing 35 for the module to provide functionality that may differ between modules. For example, a first PCB may be available for the remote I/O adapter 28 that is configured to communicate via Ethernet I/P. Other PCBs may be available for the remote I/O adapter 28 that are configured to communicate via other industrial protocols, such as Modbus, ControlNet, DeviceNet, and the like. Each remote I/O adapter 28 may include the primary PCB and one or more additional PCBs to create a PCB assembly according to the desired industrial protocols by which the remote I/O adapter 28 will communicate.

Figure 5:
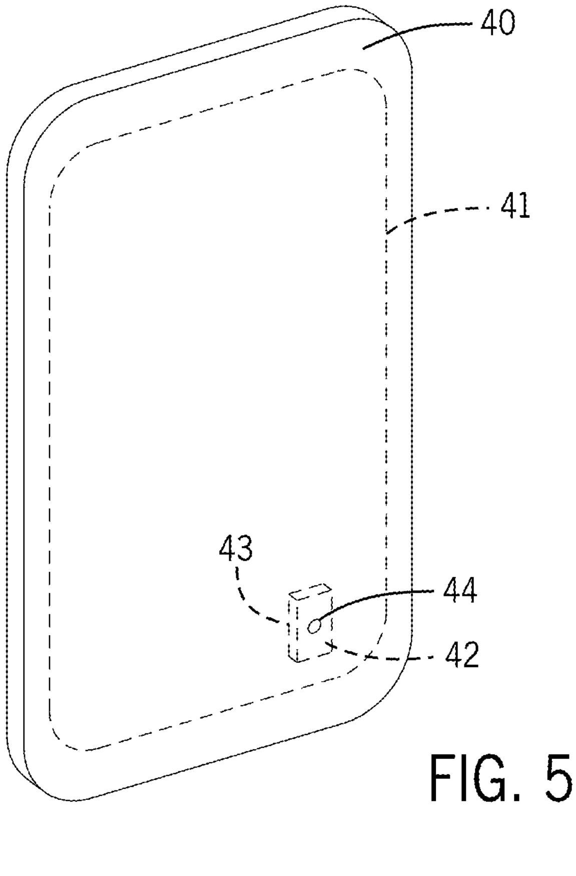
FIG. 5 is a perspective view of an outside surface of a portion of a housing with an exemplary printed circuit board and security device shown in dashed lines on the interior of the housing according to one embodiment of the invention.
Figure 6:
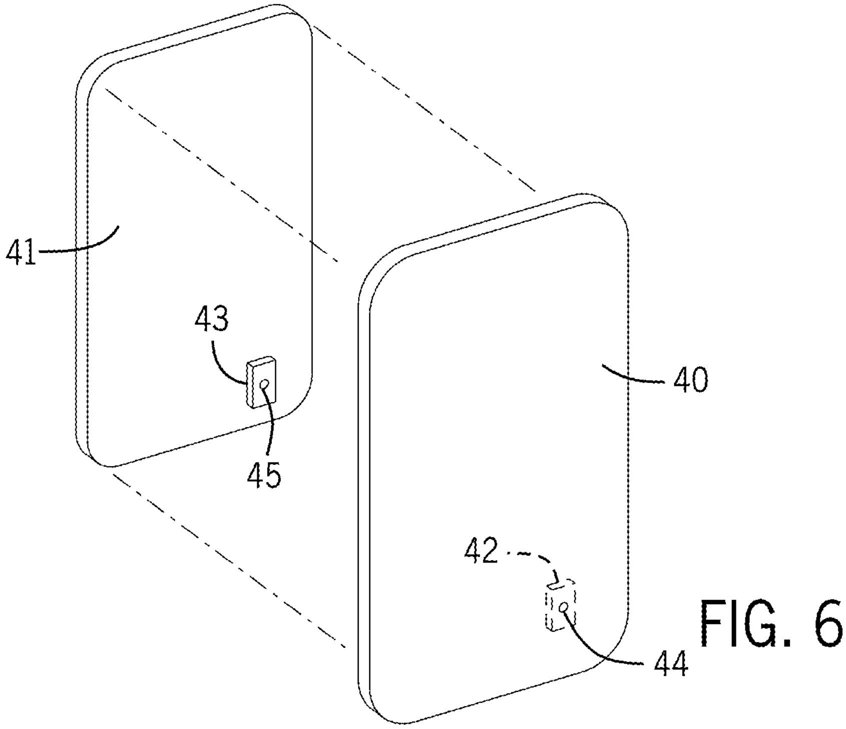
FIG. 6 is an exploded view of the housing and printed circuit board of FIG. 5 with the security device mounted on the printed circuit board.
Figure 7:
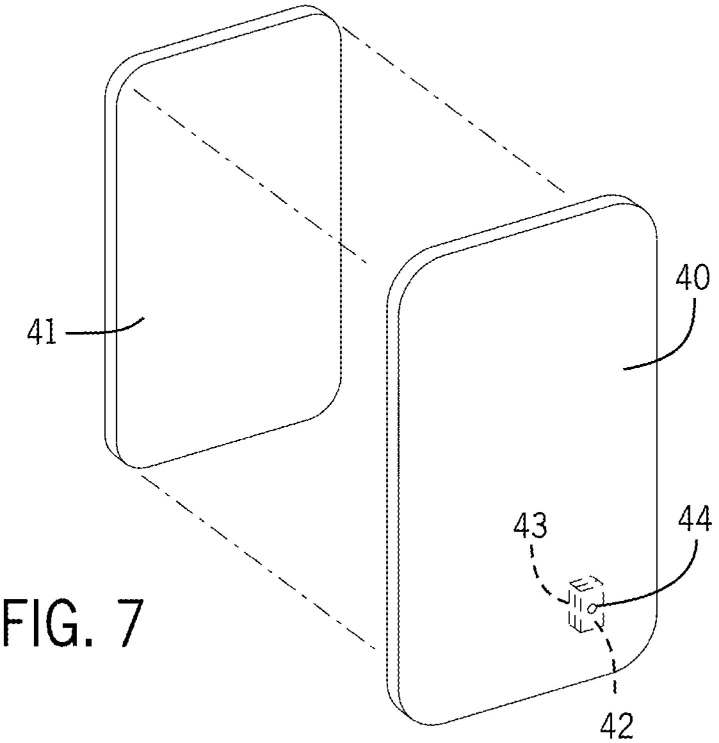
FIG. 7 is an exploded view of the housing and printed circuit board of FIG. 5 with security device retained to the housing.

Turning next to FIGS. 5-7, one aspect of the invention provides a physical verification device to ensure the PCB or PCB assembly within a module is authentic. An exemplary PCB 41 is configured to mount within a housing 40 of a module. The illustrated housing 40 is only a partial housing and may serve as one half, a side panel, or some other portion of a complete housing. The housing 40 includes a first security member 42 mounted on an interior surface of the housing. The PCB 41 includes a second security member 43 mounted on the PCB 41. When the PCB 41 is inserted into the housing 40 during assembly, the two security members 42, 43 engage in a manner to positively retain the second security member 43 to the first security member 42.

Figure 12:
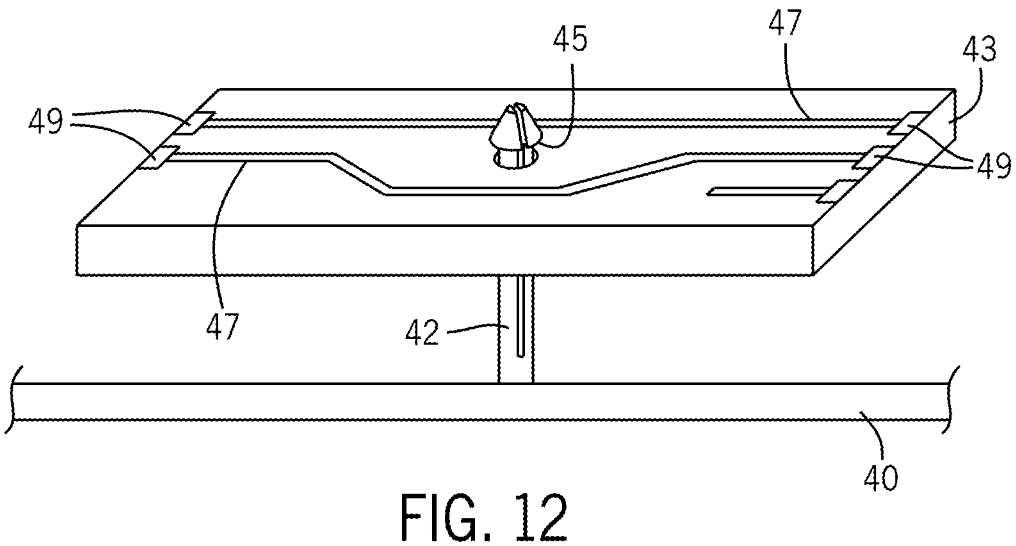
FIG. 12 is a partial perspective view of first and second security members according to one embodiment of the invention.

With reference to FIG. 12, a first embodiment of security members 42, 43 configured to retain a PCB 41 to the housing 40 is illustrated. The first security member 42 is a snap-lock pin. According to the illustrated embodiment, a first end of the snap-lock pin is integrally formed with the housing 40. Optionally, the first end of the snap-lock pin may be mounted to a separate plate which is, in turn, secured to the housing 40 or, the first end of the snap-lock pin may include a head which slides into a slot formed on the interior surface of the housing 40. According to still another embodiment, the snap-lock pin may be separately formed and joined to the housing 40 via heat, adhesive, ultrasonic welding, or the like. A second end of the snap-lock pin is configured to be inserted through an opening 45 in the second security member 43. The snap-lock pin includes two legs extending from the housing with a tapered end on each leg. As the second end of the snap-lock pin is inserted through the opening 45, the tapered ends engage the opening causing the two legs to move closer together. Once the second end of the snap-lock pin is fully through the opening 45, the two legs return to their original position, causing the ends to extend outward over the surface of the second security member 43, thereby retaining the second security member 43 to the housing 40. According to one aspect of the invention, the snap-lock pin arrangement may be used for a single-use device. As a housing 40 is mounted around the PCB or PCB assembly within the device, the first security member, that is the snap-lock pin, fits through the opening 45 in the second security member 43, positively retaining the PCB assembly to the housing 40. If the housing is opened, the second security member 43 becomes detached from its internal mounting and stays connected to the housing, rendering the internal assembly of the device inoperable.

According to the embodiment illustrated in FIG. 12, the second security member 43 is a small PCB with a pair of traces 47 extending across the PCB. The second security member 43 may be mounted to another PCB 41 within a device by insertion into a socket, soldering, or by any other suitable method. Terminals 49 on each end of the small PCB may be connected to terminals on the other PCB 41 to provide a conduction path for signals across the small PCB. The terminals 49 on each end may be connected to the other PCB 41 by insertion into the socket, by directly soldering, by joining jumper wires, or by any other suitable method for establishing an electrical connection between the terminals 49 on the small PCB and the other PCB 41 to which the second security member 43 is mounted.

Figure 13:
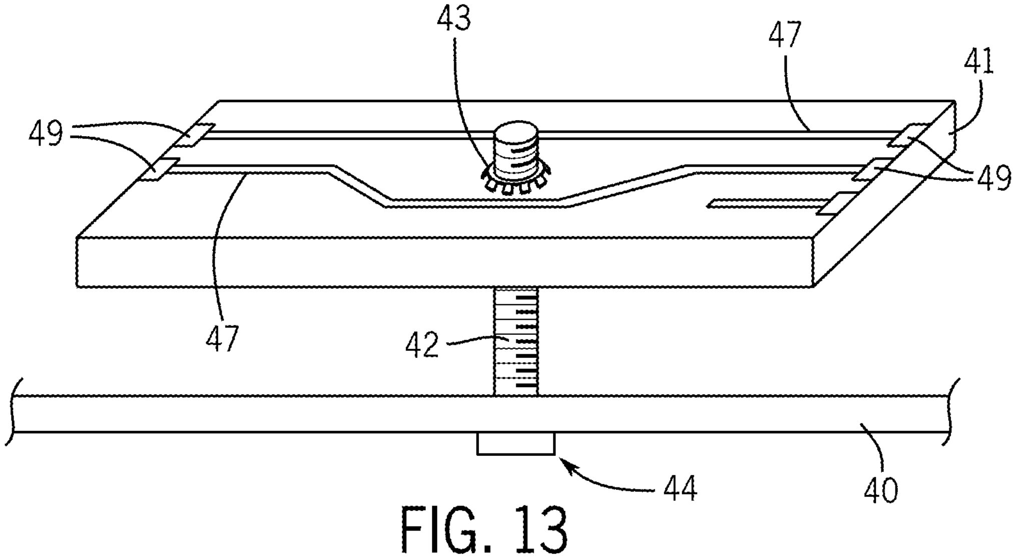
FIG. 13 is a partial perspective view of first and second security members according to another embodiment of the invention.

Turning next to FIG. 13, a second embodiment of security members 42, 43 configured to retain a PCB 41 to the housing 40 is illustrated. The first security member 42 is a threaded fastener, such as a screw or a bolt. The first security member 42 is inserted through an opening in the housing 40 and then through an opening in the PCB 41. The second security member 43 is a threaded locking washer configured to receive the first security member 42 and engage a surface of the PCB 41 to resist unintentional loosening, for example, by vibration or other motion of the device in which the PCB assembly is mounted. The threaded fastener 42 includes a receptacle 44 on the end exterior to the housing 40 configured to receive a tool. The receptacle 44 may be, for example, a slot or a pair of perpendicular slots to receive a flat-head or Philips-head screwdriver. Optionally, the receptacle may be hexagonal or star shaped to receive a hex-head wrench or a torx driver. The receptacle may take still other shapes such that a custom tool may be provided to insert or remove the threaded fastener. According to one feature of the invention, the threaded fastener may be used for a repairable device. Rather than pulling the PCB 41, through which the first security member 42 extends, off the internal mount when a housing 40 is opened, a technician with the proper tool may first remove the first security member 42. The device may be repaired and then reassembled with the first security member 42 reinserted. Although described with respect to a common fastener, such as a threaded fastener, it is another feature of the invention, that the fastener and tool required to insert or remove the fastener are proprietary to the device manufacturer. Consequently, the tool to remove or insert the fastener would not be generally available and only certified repair facilities would be able to repair a reusable module.

The first security member 42 is described above in two different embodiments as either a snap-lock pin or a threaded fastener. The second security member 43 is described above in the two different embodiments as a separate PCB in a PCB assembly or as a complementary fastener to engage the threaded fastener. The illustrated embodiments are not intended to be limiting. The first security member 42 corresponds to a first member connected to the housing 40, and the second security member 43 corresponds to a second member which is either integrally formed on a PCB, separately connected to a PCB, or may be the PCB itself where the second security member 43 engages the first security member 42 during assembly of the device to retain a PCB or a portion thereof to the housing 40 if the housing is opened without first releasing the security members. For example, the second security member 43 may be the opening 45 in a PCB configured to retain the head of the snap-lock pin fastener if the PCB 41 itself is configured to break apart upon opening the housing.

Figure 14:
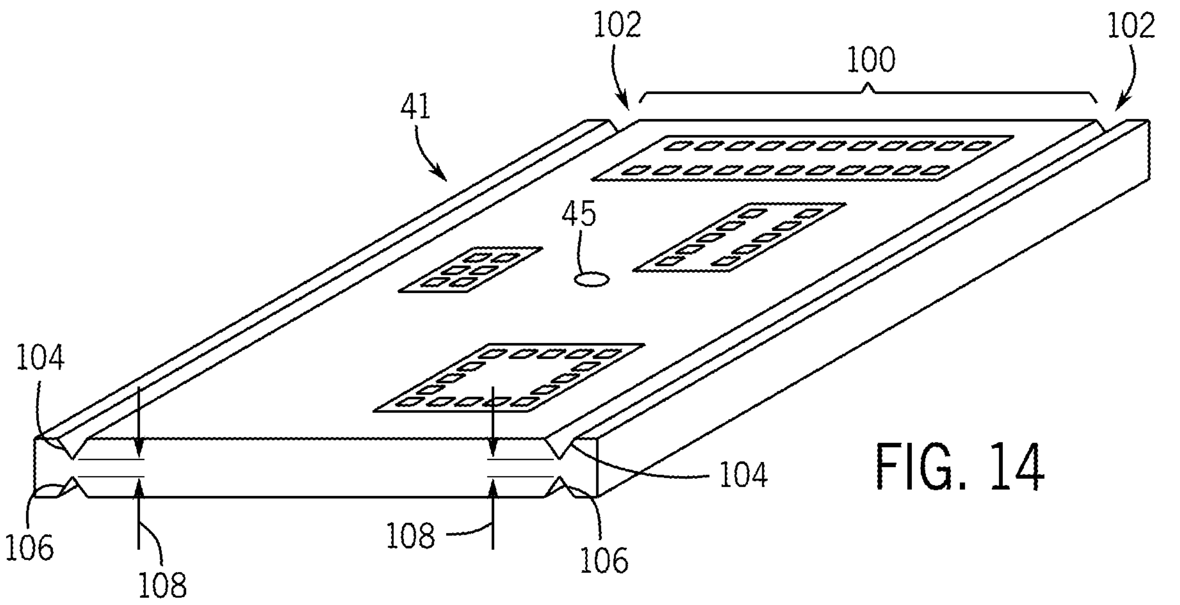
FIG. 14 is a perspective view of a printed circuit board with a break region according to one embodiment of the invention.
Figure 15:
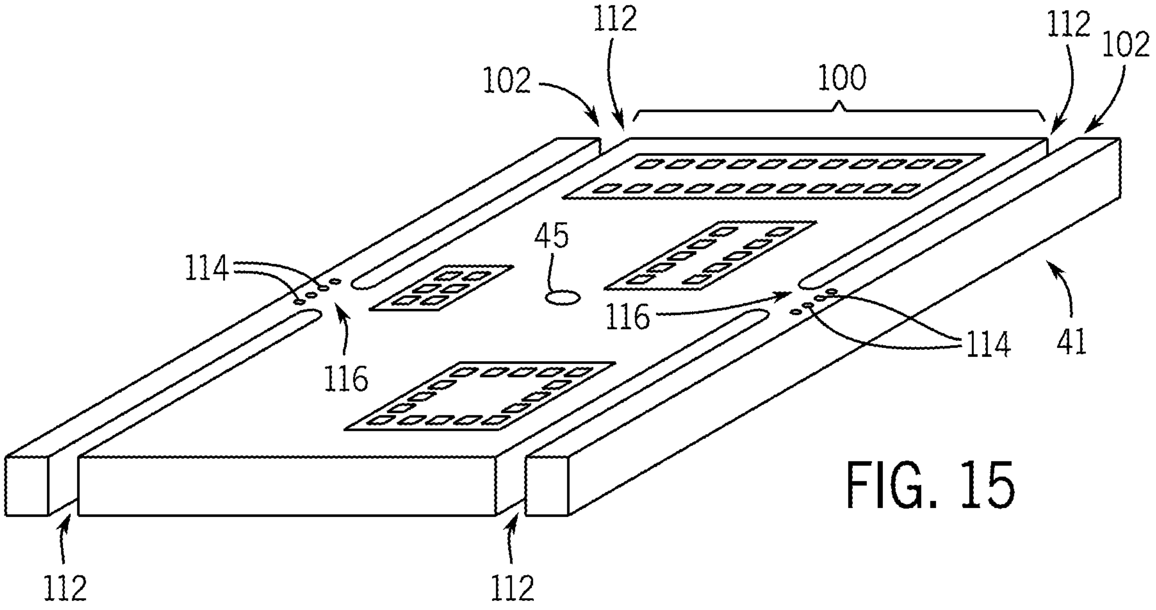
FIG. 15 is a perspective view of a printed circuit board with a break region according to another embodiment of the invention.

Turning next to FIGS. 14 and 15, two embodiments of a PCB 41 with a separable segment 100 are illustrated. A separable segment 100 is a portion of a PCB 41 configured to break apart from the rest of the PCB 41 when the device is opened and the first and second security members 42, 43 are engaged. In FIG. 14, the separable segment 100 includes a pair of break regions 102 extending along either side of the separable segment. The break region 102 is defined by a pair of grooves cut into the PCB 41. An upper groove 104 extends along a length of the upper surface of the PCB 41, and a lower groove 106 extends along a length of the lower surface of the PCB. The upper and lower grooves 104, 106 are positioned on the PCB to be opposite each other, leaving a thin connecting region 108 between the two grooves. The thin connecting region 108 keeps the separable segment 100 within the larger PCB 41 during installation and under normal operation. If the housing 40 is removed from the device while the first and second security members are engaged (for example, a snap-lock pin extends through the opening 45 within the separable segment 100), the separable segment breaks apart from the larger PCB 41 and is retained against the housing 40.

In FIG. 15, the separable segment 100 similarly includes a pair of break regions 102 extending along either side of the separable segment. The break region 102 of FIG. 15 is defined by a pair of channels 112 cut into the PCB 41. Each channel 112 extends through the entire thickness of the PCB 41. A first channel 112 extends from one end of the PCB 41 toward a central region 116 of the PCB, and a second channel 112 extends from the other end of the PCB 41 toward the central region 116 of the PCB. The first and second channels 12 leave a narrow, full thickness central region 116 on the PCB 41 between the two channels. Also adjacent to the central region 116 are a series of holes 114 drilled through the PCB 41. The holes 114 further define the break region 102 such that a force applied to the PCB will cause the separable segment 100 to detach from the PCB 41. The thin central region 116 keeps the separable segment 100 within the larger PCB 41 during installation and under normal operation. If the housing 40 is removed from the device while the first and second security members are engaged (for example, a snap-lock pin extends through the opening 45 within the separable segment 100), the separable segment breaks apart from the larger PCB 41 and is retained against the housing 40.

Figure 11:
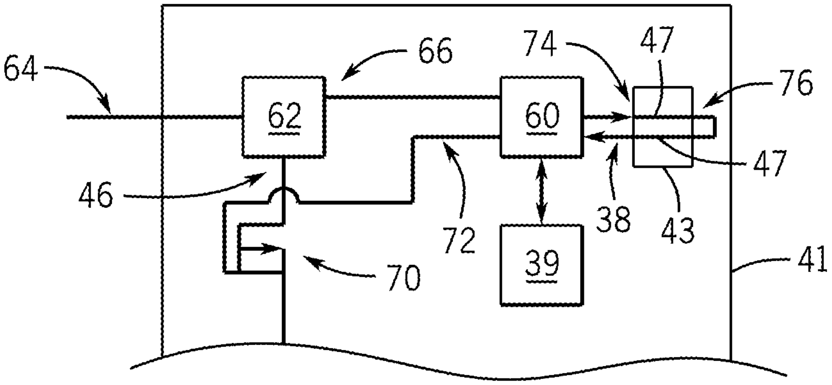
FIG. 11 is a schematic representation of a printed circuit board including a security device.

With reference next to FIG. 11, the exemplary PCB 41 includes a memory device 39 configured to store data and instructions. A processor 60 is in communication with the memory device 39 and is operative to read and/or write data to the memory device 39 and to execute the instructions stored on the memory device 39. The processor 60 is also in communication with at least one signal 74 conducted by the security member 43. According to the illustrated embodiment, one signal 74 is output from the processor 60 to the security device 43. A trace 47 on the security device 43 conducts the signal to a loop back trace 76 on the PCB 41. The security device 43 receives the signal from the loop back trace 76 and another trace 47 conducts the signal from the loop back trace 76 as an input 38 to the processor 60. This signal serves to monitor the presence of the security member 43 on the PCB 41. If the security member 43 is removed from the PCB 41, the input signal 38 would no longer be received at the processor 60 and the processor 60 determines that the security member 43 has been removed. Although illustrated with a single signal passing through the security member 43, it is contemplated that multiple signals may be routed through the security member 43. Further, a signal need not be directly routed back to the processor 60 but rather may enable another device on the PCB 41 and the processor 60 may be configured to detect when the other device is enabled in order to verify the presence of the security member 43 on the PCB 41.

The exemplary PCB 41 also includes a power supply 62 having an input 64 configured to receive power from an external power supply. The external power supply may be an Alternating Current (AC) or Direct Current (DC) power supply according to application requirements. The power supply 62 includes one or more voltage converters and/or voltage regulators to convert the voltage receives at the input 64 of the power supply to at least one control voltage, such as five volts (5 VDC) or three and three-tenths volts (3.3 VDC), to provide power to other electronic circuits and devices on the PCB 41. The illustrated power supply 62 includes a first output 66 voltage and a second output voltage 46. A switching device 70 is provided between the second output voltage 46 and devices on the PCB 41 which receive the voltage at the second output. A control signal 72 from the processor 60 is used to selectively enable the switching device 70 and to selectively provide the second output voltage to other devices on the PCB 41.

Figure 8:
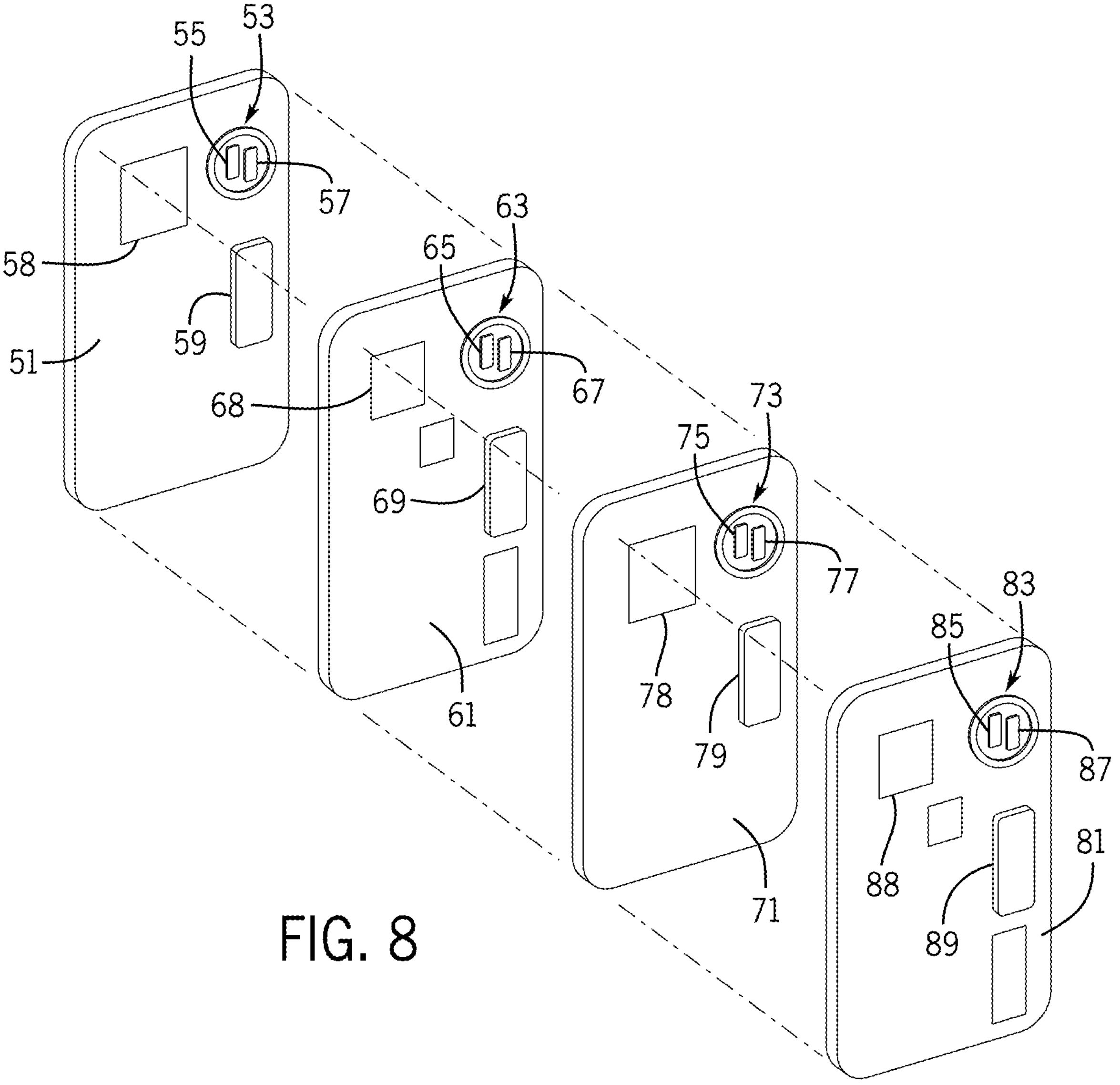
FIG. 8 is an exploded view of a printed circuit board assembly having multiple circuit boards, where each circuit board includes a near field communication circuit.
Figure 9:
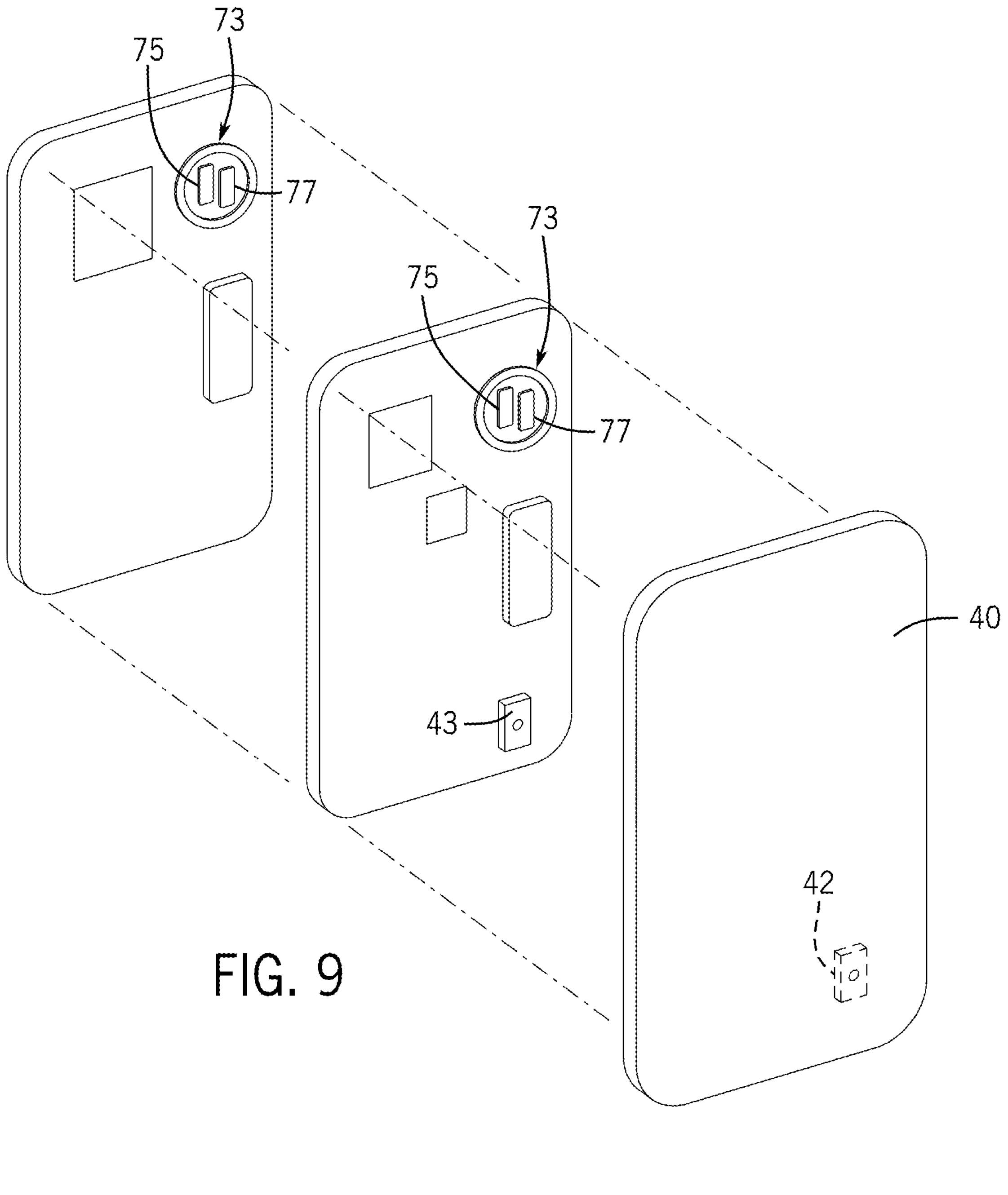
FIG. 9 is an exploded view of a printed circuit board assembly having multiple circuit boards, where each circuit board includes a near field communication circuit, and one circuit board includes a security device.

Turning next to FIG. 8, another aspect of the invention provides an NFC circuit 53 on a PCB 51 for use in verifying authenticity of the PCB 51. According to the illustrated embodiment, a PCB assembly includes four PCBs. A first PCB 51 includes a first NFC circuit 53, where the first NFC circuit has a first NFC antenna 55 and a first set of NFC devices 57. A first processor 59 and a first memory device 58 are also mounted on the first PCB 51. A second PCB 61 includes a second NFC circuit 63, where the second NFC circuit has a second NFC antenna 65 and a second set of NFC devices 67. A second processor 69 and a second memory device 68 are also mounted on the second PCB 61. A third PCB 71 includes a third NFC circuit 73, where the third NFC circuit has a third NFC antenna 75 and a third set of NFC devices 77. A third processor 79 and a third memory device 78 are also mounted on the third PCB 71. A fourth PCB 81 includes a fourth NFC circuit 83, where the fourth NFC circuit has a fourth NFC antenna 85 and a fourth set of NFC devices 87. A fourth processor 89 and a fourth memory device 88 are also mounted on the fourth PCB 81. Although illustrated with four PCBs, it is understood the PCB assembly may include any number of PCBs.

Figure 10:
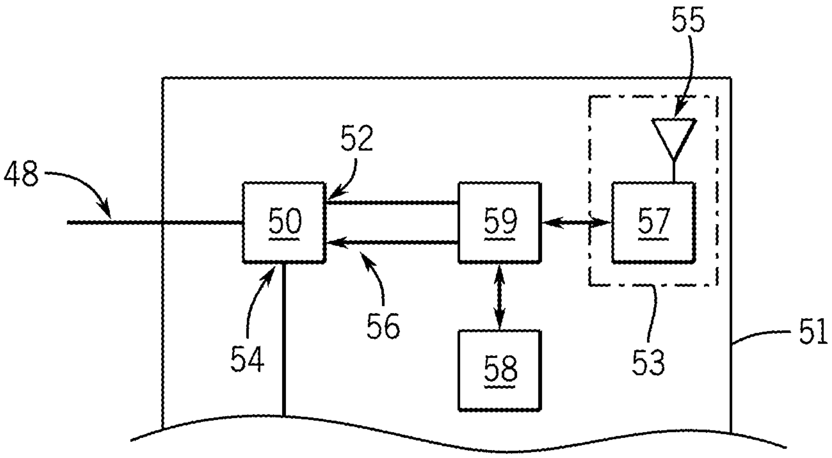
FIG. 10 is a schematic representation of a printed circuit board including a near field communication circuit.

With reference also to FIG. 10, additional interconnections for the first PCB 51 are illustrated. For ease of discussion, the additional interconnections will be discussed only with the first PCB 51 from the PCB assembly of FIG. 8. It is understood similar connections may exist on other PCBs in the PCB assembly. The memory device 58 is configured to store data and instructions. The processor 59 is in communication with the memory device 58 and is operative to read and/or write data to the memory device 58 and to execute the instructions stored on the memory device 58. The processor 59 is also in communication with the NFC circuit 53. The NFC circuit 53 includes at least one NFC device 57 and an NFC antenna 55. It is contemplated the NFC antenna 55 may be embedded within the NFC device 57. Optionally, the NFC antenna 55 may be one or more traces on the PCB 51. At least one NFC device 57 on the PCB assembly is an NFC reader. The NFC reader receives power from a power supply 50 on the PCB 51 and may emit a radio frequency (RF) signal to other NFC devices within range of the reader. The RF signal emitted from the NFC reader has sufficient power to energize passive NFC devices such that the NFC reader may communicate with passive NFC devices. Each NFC circuit 53 includes an NFC device 57 with a unique identifier embedded in the NFC device. As will be discussed in more detail below, the unique identifier is generated during manufacture of the device. The unique identifier is written into the NFC device and locked in a manner such that it may not be overwritten by a user of the device.

The first PCB 51 also includes a power supply 50 having an input 48 configured to receive power from an external power supply. The external power supply may be an Alternating Current (AC) or Direct Current (DC) power supply according to application requirements. The power supply 50 includes one or more voltage converters and/or voltage regulators to convert the voltage receives at the input of the power supply 50 to at least one control voltage, such as five volts (5 VDC) or three and three-tenths volts (3.3 VDC), to provide power to other electronic circuits and devices on the PCB 51. The illustrated power supply 50 includes a first output 52 voltage, a second output voltage 54, and a control signal input 56 used to enable the second output voltage.

In operation, the system disclosed herein provides for a mechanical and/or an electrical apparatus for protecting authenticity of a product. With reference again to FIGS. 5-7, the first and second security members 42, 43 work together to provide a mechanical apparatus for verifying authenticity of the PCB assembly within a product. With reference again to FIG. 8, the NFC circuits 53, 63, 73, 83 on each of the PCBs 51, 61, 71, 81 of a PCB assembly provide an electrical apparatus for verifying authenticity of the PCB assembly. The electrical and mechanical apparatuses may be provided separately or in combination to ensure authenticity of a product which includes a PCB assembly.

As illustrated in FIG. 6, the housing 40 includes first security member 42 mounted on an interior surface of the housing, and the PCB 41 includes a second security member 43 mounted on the PCB 41. During assembly of the device, the PCB 41 is either inserted into the housing 40, or a portion of the housing 40 on which the first security member 42 is located, is attached to the remainder of the housing. As the PCB 41 and the housing 40 are positioned next to each other, the first security member 42 engages the second security member 43 to positively retain the PCB 41 with the housing 40. The purpose of the mechanical connection is to prevent subsequent separation of the PCB 41, of a daughter PCB mounted on the PCB, or of a separable segment 100 in the PCB 41 from the housing 40 unless the first security member 42 is configured to be releasable via a tool. As shown in FIG. 6, if the housing 40 and the PCB 41 are separated while the first and second security members 42, 43 are engaged, the portion of the PCB 41 or the daughter board remains connected to the housing 40 and is separated from the PCB 41. If a third party attempts to repair the device or remove components from the device for use in another device, opening the housing 40 would cause physical damage to the PCB 41 within the device, rendering the PCB inoperable. As discussed above, traces 47 may be present on the daughter board or on the separable segment 100 which are disconnected from the PCB 41. Opening these traces prevent signals required for proper operation from being transferred on the PCB 41.

According to one feature of the invention, a processor 60 mounted on the PCB 41 may be configured to perform a verification check for the presence of the signals conducted via the traces 47 in order to permit operation of the device in which the PCB 41 is mounted. According to one aspect of the invention, the traces 47 may be provided solely for verification purposes. The processor 60 may be configured to periodically generate a pulse transmitted via the pulse and returned to an input 38 on the processor. If the processor 60 detects the input after sending the pulse, the processor verifies the presence of the traces 47 on the PCB. Alternately, the traces 47 may be used to transmit signals to other electrical devices on the PCB 41. The processor 60 may monitor operation of these devices to verify whether the traces 47 are present. Incorrect operation of the device may indicate the loss of signals transmitted via the traces 47. This verification checks whether the PCB 41 was at some point removed from a housing 40 and had the traces 47 pulled from the PCB 41 as a result of the physical connection between security members.

It is contemplated that a third party may attempt to repair a PCB 41 on which traces 47 have been removed as a result of the first and second security members 42, 43. The third party may attempt to reinsert a replacement daughter board, connect jumper wires between terminals, or in some other manner attempt to reestablish connections lost when the PCB 41 was removed from the housing 40. According to another feature of the invention, the PCB 43 may include additional traces, not used by the PCB 41 to provide confusion about the proper connection. With reference, for example, to FIG. 12, one side of the security PCB 43 includes two terminals 49 and the other side of the security PCB 43 includes three terminals. Including multiple unconnected terminals, routing one input terminal to multiple output terminals, or other methods of obfuscating the proper connections for the security PCB 43 render repair of the PCB 41 more difficult.

The authentication check for the traces 47 may be performed as the device in which the PCB assembly is located is powering up. The power supply 62 is able to supply power from the first power output 66 to the processor 60 and memory 39 to enable that portion of the PCB 41 separately from other devices on the PCB. The processor 60 performs the verification process as part of a power-up/initialization process for the device. When the processor 60 determines that the traces 47 are present, the processor 60 generates the control signal 72 to the switching device 70 to connect the second output 46 from the power supply 62 to the remainder of the devices on the PCB. The remainder of the circuits on the PCB 41 are enabled via power from the second output 46 from the power supply 62 and once verification is complete, the rest of the PCB 41 may then proceed through the power up sequence. If, however, the processor 60 does not detect the presence of the traces 47, the processor 60 never generates the control signal 72 to the switching device 70 and the rest of the PCB 41 remains without power. Additional devices on the PCB 41 or within the device, which receive power from the power supply 62, include, for example, light-emitting diodes (LEDs) visible from the exterior of the device. These LEDs include status indicators, including a power-on or enable LED, indicating to an operator that the device is powered on and functional. Thus, when verification fails, the remainder of the device remains disabled and provides no indication that the device attempted to power up. Optionally, the switch 70 may not be present and the entire PCB 41 receives power during the power-up sequence. The processor 60 may be configured to execute the verification check as an initial step in the power-up sequence. If the verification fails, the processor 60 may cause the PCB 41 to shut back down or to simply disable outward indications that the device is enable and disable operation of functions controlled by the processor 60, preventing operation of the product after failing verification.

According to still another aspect of the invention, the processor 60 may be further configured to overwrite at least a portion of the instructions stored in memory 39 when the verification fails. As previously indicated, a third party may attempt to repair a PCB 41 on which traces 47 have been removed as a result of the first and second security members 42, 43. Although incorrect repair may fail to initially pass the verification process, the third party may repeatedly attempt to replace the traces 47 which were removed until successful. To deter repeated attempts at repairing traces 47, the processor 60 may be configured to corrupt the firmware when the verification fails. In addition to not generating the output signal 72 to power up the rest of the PCB 41, the processor 60 may also overwrite instructions stored in memory 39. Overwriting the instructions corrupts the firmware required for proper operation of the device and permanently disables the device. Thus, if a third party attempts to repair traces 47 which have been detached and is not successful, the third party gets only a single attempt before the device is rendered inoperable.

As illustrated in FIG. 8, NFC circuits 53, 63, 73, 83 are used to provide an electronic apparatus for verifying authenticity of PCBs 51, 61, 71, 81 in a device. At least one of the NFC circuits 53, 63, 73, 83 includes an NFC reader. For purposes of discussion, the NFC device 57 on the first PCB 51 will be discussed as an NFC reader. It is contemplated that the NFC reader may be located on another PCB in the PCB assembly. The processor 59 on the first PCB 51 activates the NFC reader 57 such that it emits RF signals used to energize at least one passive NFC device on another PCB 61, 71, 81. In order to facilitate energy transfer from the NFC reader 57 to passive NFC devices, each NFC circuit 53, 63, 73, 83 is generally aligned with the other NFC circuits on adjacent PCBs. The NFC reader 57 requests identification numbers from other NFC devices within range and receives the identification numbers in return. According to one aspect of the invention, the NFC circuit 53 may include one or more devices to compare the identification numbers received from other NFC devices to the identification number stored in the NFC reader 57. Alternately, the identification numbers received from the other NFC devices are transmitted to the processor 59, where each identification number is compared to the identification number in the NFC reader 57 as well as to each other. If all of the identification numbers correspond, then the NFC circuit 53 or the processor 59 verify that each PCB 51, 61, 71, 81 in the PCB assembly is authentic.

The authentication check by the NFC circuit 53 may be performed as the device in which the PCB assembly is located is powering up. The power supply 50 is able to supply power from the first power output 52 to the processor 59, memory 58, and NFC circuit 53 to enable that portion of the device. The processor 59 performs the verification process as part of a power-up/initialization process for the device. When the processor 59 determines that the unique identification number stored on each PCB matches the others, the processor 59 generates the control signal 56 to the power supply 50 to enable the second output 54 from the power supply. The remainder of the circuits on the PCB 51 are enabled via the second output 54 from the power supply 50 and once verification is complete, the rest of the PCB 51 may then proceed through the power up sequence. If, however, the processor 59 does not detect the same unique identification number stored on each PCB, the processor 59 never generates the control signal 56 to the power supply 50 and the rest of the PCB 51 remains without power. Additional devices on the PCB 51 or within the device, which receive power from the power supply 50, include, for example, light-emitting diodes (LEDs) visible from the exterior of the device. These LEDs include status indicators, including a power-on or enable LED, indicating to an operator that the device is powered on and functional. Thus, when verification fails, the remainder of the device remains disabled and provides no indication that the device attempted to power up.

According to still another aspect of the invention, the processor 59 may be further configured to overwrite at least a portion of the instructions stored in memory 58 when the verification fails. A third party may attempt to repair a device by assembling PCBs 51, 61, 71, 81 from multiple devices. Even though a PCB is selected from a similar device, different features may be enabled, different versions of firmware may be stored in the PCB, or still other variations may be present which prevent the device from operating properly. Because the unique identifier stored in the NFC circuit 53, 63, 73, 83 is a function of an identifier, such as the serial number, which is unique for each device, the PCBs 51, 61, 71, 81 in a single device are initially matched to each other and have the same identifier. If a third party attempts to repair a first device by replacing the PCB with a board from another device, the identifiers will not match and verification will fail. In addition to not generating the output signal 56 to power up the rest of the PCB 51, the processor 59 may also overwrite instructions stored in memory 58. Overwriting the instructions corrupts the firmware required for proper operation of the device and permanently disables the device.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. A system for authentication of a product, the system comprising:

a printed circuit board assembly, further comprising:

a first printed circuit board including a first near field circuit, and a second printed circuit board, including a second near field circuit, wherein the first near field circuit is in communication with the second near field circuit;

a memory mounted on either the first printed circuit board or the second printed circuit board, wherein the memory is operative to store a plurality of instructions;

a processor mounted on either the first printed circuit board or the second printed circuit board, wherein the processor is operative to:

read a first identifier from the first near field circuit, read a second identifier from the second near field circuit, and verify that the first identifier is identical to the second identifier.

2. The system of claim 1, wherein:

a unique identifier is generated as a function of a serial number for the product, the first identifier is set equal to the unique identifier, and the second identifier is set equal to the unique identifier.

3. The system of claim 1, wherein the processor is operative to read the first identifier, read the second identifier, and verify that the first identifier is identical to the second identifier during a power up sequence for the product.

4. The system of claim 3, further comprising a power supply circuit including:

a first power output to provide power to the processor, a second power output to provide power to a remainder of the product, and a switch to selectively enable the second power output, wherein:

the switch disables the second power output while the processor reads the first identifier and the second identifier and verifies that the first identifier is identical to the second identifier, the switch disables the second power output when the processor determines the first identifier is not identical to the second identifier, and the switch enables the second power output when the processor verifies that the first identifier is identical to the second identifier.

5. The system of claim 3, wherein the processor is further operative to overwrite at least a portion of the instructions stored in the memory to disable the product when the processor determines the first identifier is not identical to the second identifier.

6. The system of claim 1, further comprising:

a housing for the product, the housing including an interior surface and an exterior surface;

a first security member mounted to an interior surface of the housing; and a second security member mounted on either the first or second printed circuit board, wherein:

when the printed circuit board assembly is mounted within the housing, the first security member engages the second security member to positively retain either the first or second printed circuit board to the housing.

7. The system of claim 6, further comprising a key operative to engage at least one of the first and the second security members to disengage the first security member from the second security member.

8. The system of claim 6, wherein:

the first security member is a retaining member secured to the housing; and the second security member is an opening through which the retaining member is inserted during assembly of the product to positively retain either the first or second printed circuit board to the housing.

9. The system of claim 8, wherein:

either the first or second printed circuit board including the second security member further includes at least one break region; and when the first or second printed circuit board including the second security member is removed from the housing, the second security member causes either the first or second printed circuit board including the second security member to break at the at least one break region and at least a portion of the first or second printed circuit board stays connected to the housing.

10. A system for authentication of a product, the system comprising:

a housing including an interior surface and an exterior surface;

at least one printed circuit board mounted within the housing;

a first security member mounted to an interior surface of the housing; and a second security member mounted on the at least one printed circuit board, wherein:

when the at least one printed circuit board is mounted within the housing, the first security member engages the second security member to positively retain the at least one printed circuit board to the housing.

11. The system of claim 10, wherein:

the first security member is a retaining member secured to the housing; and the second security member is an opening through which the retaining member is inserted during assembly of the product to positively retain the at least one printed circuit board to the housing.

12. The system of claim 11, further comprising a key operative to engage the first security member to selectively engage the first security member with the second security member.

13. The system of claim 11, wherein:

the opening through which the retaining member is inserted is located on an additional printed circuit board mounted on the at least one printed circuit board;

at least one trace from the at least one printed circuit board is routed through the additional circuit board; and when the at least one printed circuit board is removed from the housing, the second security member retains the additional printed circuit board to the housing, detaches the additional printed circuit board from the at least one printed circuit board, and causes the at least one trace to open.

14. The system of claim 11, wherein:

the opening through which the retaining member is inserted is located in the at least one printed circuit board;

the at least one printed circuit board includes at least one break region; and when the at least one printed circuit board is removed from the housing, the second security member retains at least a portion of the at least one printed circuit board to the housing, causing the at least one printed circuit board to break at the at least one break region.

15. The system of claim 11 further comprising:

a trace on the at least one printed circuit board that opens when the at least one printed circuit board is removed from the housing; and a processor mounted on the at least one printed circuit board, wherein the processor is operative to detect whether the at least one trace is open or conducting.

16. The system of claim 15, wherein the processor is operative to detect whether the at least one trace is open or conducting during a power up sequence for the product.

17. The system of claim 16, further comprising a power supply circuit including:

a first power output to provide power to the processor, a second power output to provide power to a remainder of the product, and a switch to selectively enable the second power output, wherein:

the switch disables the second power output while the processor detects whether the at least one trace is open or conducting, the switch disables the second power output when the processor determines the at least one trace is open, and the switch enables the second power output when the processor determines the at least one trace is conducting.

18. The system of claim 16, further comprising a memory mounted on the at least one printed circuit board, wherein:

the memory is operative to store a plurality of instructions, and the processor is further operative to overwrite at least a portion of the instructions stored in the memory to disable the product when the processor determines the at least one trace is open.

19. The system of claim 10, wherein:

the at least one printed circuit board includes:

a first printed circuit board with a first near field circuit, and a second printed circuit board with a second near field circuit;

the first near field circuit is in communication with the second near field circuit;

the system further comprises:

a memory mounted on either the first printed circuit board or the second printed circuit board, wherein the memory is operative to store a plurality of instructions; and a processor mounted on either the first printed circuit board or the second printed circuit board, wherein the processor is operative to:

read a first identifier from the first near field circuit, read a second identifier from the second near field circuit, and verify that the first identifier is identical to the second identifier.

20. The system of claim 19, wherein:

a unique identifier is generated as a function of a serial number for the product, the first identifier is set equal to the unique identifier, and the second identifier is set equal to the unique identifier.

* * * * *